(12) United States Patent
Höhn et al.

(10) Patent No.: US 6,888,174 B2
(45) Date of Patent: May 3, 2005

(54) OPTO-ELECTRONIC SEMICONDUCTOR COMPONENT

(75) Inventors: Klaus Höhn, Taufkirchen (DE); Dieter Meiss, Augsburg (DE)

(73) Assignee: Patent-Treuhand-Gesellschaft fur elektrische Gluhlampen mbH, Munich (DE)

( * ) Notice: Subject to any disclaimer, the term of this patent is extended or adjusted under 35 U.S.C. 154(b) by 91 days.

(21) Appl. No.: 10/392,584

(22) Filed: Mar. 20, 2003

(65) Prior Publication Data

US 2003/0178632 A1 Sep. 25, 2003

(30) Foreign Application Priority Data

Mar. 25, 2002 (DE) .......................................... 102 13 294

(51) Int. Cl.⁷ ................................................. H01L 33/00
(52) U.S. Cl. .......................... 257/100; 257/89; 257/99; 257/98; 257/81
(58) Field of Search .............................. 257/89, 98, 99, 257/100, 81, 101

(56) References Cited

U.S. PATENT DOCUMENTS

| | | | | |
|---|---|---|---|---|
| 3,939,488 A | * | 2/1976 | Wakashima et al. | ........ 257/786 |
| 5,824,722 A | | 10/1998 | Ohnishi et al. | |
| 6,045,721 A | | 4/2000 | Zachau et al. | |
| 6,066,861 A | | 5/2000 | Höhn et al. | |
| 2003/0144414 A1 | * | 7/2003 | Bogner et al. | ............... 524/714 |

FOREIGN PATENT DOCUMENTS

| | | |
|---|---|---|
| CA | 2185878 | 3/1997 |
| CN | 1307072 | 8/2001 |
| DE | 38 04 293 A1 | 8/1989 |
| WO | WO 98/06575 | 2/1998 |
| WO | WO 01/10926 A1 | 2/2001 |
| WO | WO 01/50540 A1 | 7/2001 |

* cited by examiner

Primary Examiner—Nathan J. Flynn
Assistant Examiner—Fazli Erdem
(74) Attorney, Agent, or Firm—Frishauf, Holtz, Goodman & Chick, P.C.

(57) ABSTRACT

For improved ageing stability, an inorganic UV stabilizer, especially cerium aluminate, is added to the polymer so that the UV stability is improved.

9 Claims, 2 Drawing Sheets

OPTO-ELECTRONIC SEMICONDUCTOR COMPONENT

TECHNICAL FIELD

The invention is based on an opto-electronic semiconductor component according to the preamble of claim 1. It particularly involves a light-emitting diode employing a UV-stable polymer based on a transparent reactive resin matrix, especially an epoxy casting resin, which contains a UV stabilizer, achieves longer operating times in respect of ageing due to UV radiation, and is therefore useful especially for encapsulating light-emitting diodes.

BACKGROUND ART

It is known that plastics/polymers age owing to the effect of environmental influences such as moisture, temperature, radiation, chemicals or owing to the effect of mechanical stresses. The use of plastic in technical products is compromised by the effect of electromagnetic radiation. Such electromagnetic radiation primarily involves the high-energy radiation component in the sunlight spectrum with a wavelength <500 nm. The effect of this radiation can lead to photochemical degradation of plastics, and therefore to shortening of the lifetime of plastics in outdoor applications and in opto-electronics. Protective layers made of polymer films with UV absorbers such as titanium oxide or zinc oxide are therefore often used for metals, see WO 98/06575. Further UV absorbers for UV-stable plastics can be found, for example, in CN 1307072.

The light emitted by light-emitting diodes (LEDs) is generated by recombination of electrons and holes in the junction of a semiconductor, the energy released during the recombination being radiated as light. LEDs, and especially luminescent diodes, are often encapsulated using high-purity, water-clear and non-yellowing epoxy resin systems/epoxy casting resins. Such encapsulated light-emitting diodes are used, for example, with polymer-based light-conversion elements as SCW (single chip white) LEDs, also referred to as luminescence-conversion LEDs, in the automobile industry. UV- and blue-emitting luminescent diodes consist of semiconductors based on GaN or InGaN, which can also be used in conjunction with known phosphors (primarily such as cerium-doped garnets of the rare earths Y, Gd, La, Lu and Tb) in order to achieve a white mixed color and special colors.

The lifetimes currently being achieved for wavelength-converting potting compounds in blue and SCW LEDs are insufficient for the SCW light-conversion concept to be used in general lighting with bright light-emitting semiconductors based on GaN (also Al and/or In, especially InGaN).

Ageing of the plastic matrix/polymer matrix covering a semiconductor in light-emitting diodes, due to environmental effects as well as the short-wavelength radiation emitted by the semiconductors, can lead to changes in the range of emitted wavelengths, and therefore to a color shift of the light-emitting diodes, to a change in the radiation characteristics as well as to a change in the brightness of the emitted light.

This ageing leads to an insufficient long-term operating time of the light-emitting diodes, and currently restricts their use significantly, particularly in general lighting.

The opto-electronic semiconductor component is already known from WO 01/50540. Specifically, it describes a potting compound which is based on epoxy resin systems or similar materials, such as epoxy-novolac blends. In this case, particularly, a UV light-stabilizing component is also included with a proportion of up to 2% by weight. But stabilizers used in this capacity have hitherto exclusively been organic materials, which are described in more detail in CA 2 185 878 and U.S. Pat. No. 5,824,722, for example. These are pure radical traps, however, which only partly fulfill their function. Under the operating conditions in which thermal, moisture and radiation stresses occur in combination, these stabilizers are not sufficiently long-term stable, lose their effectiveness owing to migration, or become chemically modified.

DISCLOSURE OF THE INVENTION

It is an object of the present invention to provide an opto-electronic semiconductor component with a semiconductor body that emits electromagnetic radiation of a wavelength range with an intensity maximum at a wavelength $\geq 420$ nm, the semiconductor body being embedded in a potting resin having a UV-stable polymer, which, inter alia, also contains a UV radiation stabilizer, which permits protection against radiation-induced ageing phenomena of polymers by said addition of a UV radiation stabilizer.

This object is achieved by the UV light stabilizer being an inorganic material which absorbs radiation well at least in the range of from 360 to 400 nm and as far as possible only deactivates non-radiatively, the stabilizer absorbing the UV component $\leq 400$ nm of the emission by the semiconductor body. Particularly advantageous configurations can be found in the dependent claims.

In the UV-stable polymers according to the invention, a UV stabilizer is intended to be dispersed in a transparent polymer, which in particular has a refractive index n of between 1.4 and 1.65, especially from 1.50 to 1.6. It is desirable for the refractive index of the plastic to be as high as possible, so as to achieve maximum light output from the light-emitting chip and hence to minimize the light losses when passing from the chip to the adjacent plastic.

The use of the UV stabilizers according to the invention leads to selective absorption of the short-wavelength light radiation (the region below 400 nm, especially from 360 to 400 nm, is important) and its (at least substantial) conversion into heat energy, so that the photochemical degradation in the plastic/polymer is significantly reduced.

The result of this reduced photochemical degradation is a significantly increased lifetime of the light-emitting diodes, and it allows the polymer-containing diodes according to the invention with improved UV stability to be used in general lighting, as well as in the automotive field and in display technology.

The UV-stable polymer offers the advantage, owing to the UV-stabilizing pigments, that the latter can be added directly to polymers and/or conversion phosphors and/or converter resins and/or clear resins. The necessary process steps can be integrated without great difficulty into established casting-resin and molding-compound processes.

A particular advantage is derived from the fact that the dispersion of inorganic UV stabilizers is not limited by solubility in the polymer, as is the case with organic UV stabilizers. It is therefore unnecessary to have different layer thicknesses than the conventional production methods. It is particularly advantageous that the UV-stable polymers can therefore be produced inexpensively.

According to the invention, an inorganic thermally stable and non-hydrolyzable UV-stabilizing pigment is dispersed in a polymer. Dispersing the UV-stabilizing pigments with the particle size according to the invention in a casting resin offers the advantage of a homogeneous distribution; the UV stabilizers according to the invention resist breakdown under the moisture-temperature-current conditions customary of electronics, and they do not bleed. Dispersions also offer the advantage of protecting the components both against exposure to UV light from outside, i.e. sunlight, and also especially against UV radiation emanating from a semiconductor arranged inside the encapsulation, and hence of reducing the problematic stress on the internal interfaces of the light-emitting diodes.

Simple aluminates, especially of cerium, are in particular preferred as the stabilizers, as well as other cerium compounds, primarily oxides ($CeO_2$). Titanium oxides ($TiO_2$) and zinc oxides (ZnO), in particular, are furthermore suitable as stabilizers, the compounds not containing cerium often being usable as additives (up to 30%) to compounds containing cerium. Primarily aluminates with a perovskite structure are suitable, or alternatively a garnet structure; these can be mixed particularly well with similarly structured phosphors having a garnet structure, such as YAG:Ce. Besides $CeAlO_3$ and $Ce_3Al_5O_{12}$, Ba—Mg aluminates such as $BaMgAl_2O_3$ or $BaMgAl_{10}O_{17}$ are also suitable. Ba—Mg aluminates (BAMs) may in particular also be doped, advantageously with Eu and/or Mn, so that they do not dissipate the absorbed radiation as a side-effect, but instead convert it into longer-wavelength and therefore usable radiation. In this way, the efficiency of the semiconductor component can be increased further and the color-fastness in white LEDs can be improved. BAMs with a high Eu doping content are particularly suitable, as are known in another context from U.S. Pat. No. 6,045,721.

Further advantageous properties are derived from the selective absorption of the short-wavelength light radiation, so that the desired range of the emission by the primary light source can pass substantially unimpeded through the component. It is particularly advantageous that the radiation absorbed by the UV stabilizers is converted into heat energy, which also heats the component slightly. A particularly advantageous use involves UV stabilizers being used which have only a slight coloration of their own and which only insubstantially affect the emission spectra of the luminous diodes in the visible range, no conversion of light to long wavelengths being observed when the UV stabilizers according to the invention are used. In this case, in particular, the aluminates do not shorten either the storage stability of the individual resin components or the working lifetime of the reactive resins. It is also advantageous that the UV stabilizers exhibit virtually no effect on the chemically reactive behavior of the reactive resins during processing. This solution furthermore offers the advantage that the moisture absorption behavior and the glass transition temperature of the polymer encapsulation compounds are not compromised. A further embodiment involves doped inorganic compounds (on their own or in combination with undoped compounds), which convert perturbing UV radiation instead of dissipating it.

In a particularly preferred embodiment, the particle size distribution for the UV stabilizer has a d50 value <5.0 μm, especially ≦4.5 μm; in another preferred embodiment, the d100 value is <10.0 μm. These particle sizes offer the advantage that, for example, the cerium aluminate does not exhibit any sedimentation problems and does not become concentrated at the surface of the liquid polymer melts. A very constant thickness of the light-conversion element, and a uniform distribution of the UV stabilizers dispersed in it, are particularly advantageous for achieving a uniform and consistent color/wavelength range of the radiated light.

A further advantage of the small particle diameters of the UV stabilizers is the consequently larger active surface area, which increases the effectiveness of the additives in the polymer matrix.

An advantageous particular embodiment involves a semiconductor component whose chip is embedded in a potting resin, the resin having a corresponding inorganic stabilizer. In particular, the semiconductor component is provided with a first covering, preferably applied using the layer casting process, which consists of the polymer with improved UV stability according to the invention. The radiation emitted by the semiconductor element is therefore directly absorbed inside the luminescence-conversion element and the radiation density is reduced in the luminescence-conversion element, which has a positive effect on the lifetime of the component.

In particular, a UV stabilizer according to the invention is intended to be dispersed in a transparent, thermally non-yellowing polymer. Transparent polymers in the context of the invention are base polymers which, with a 1 mm layer thickness of the polymer sample, have a transmission of 85–92% in the range between 400–800 nm. In particular, polymers which exhibit a color-locus shift <0.010 of the two color coordinates x, y are thermally non-yellowing in the context of the invention.

In further embodiments, a UV stabilizer according to the invention is intended to be dispersed in further elastomers and/or thermoplastic/thermosetting materials, advantageously in an epoxy resin matrix or in acrylate resins (PMMA) or silicones.

BRIEF DESCRIPTION OF THE DRAWINGS

The invention will be explained in more detail below with reference to several exemplary embodiments.

BEST MODE FOR CARRYING OUT THE INVENTION

Figure 1:
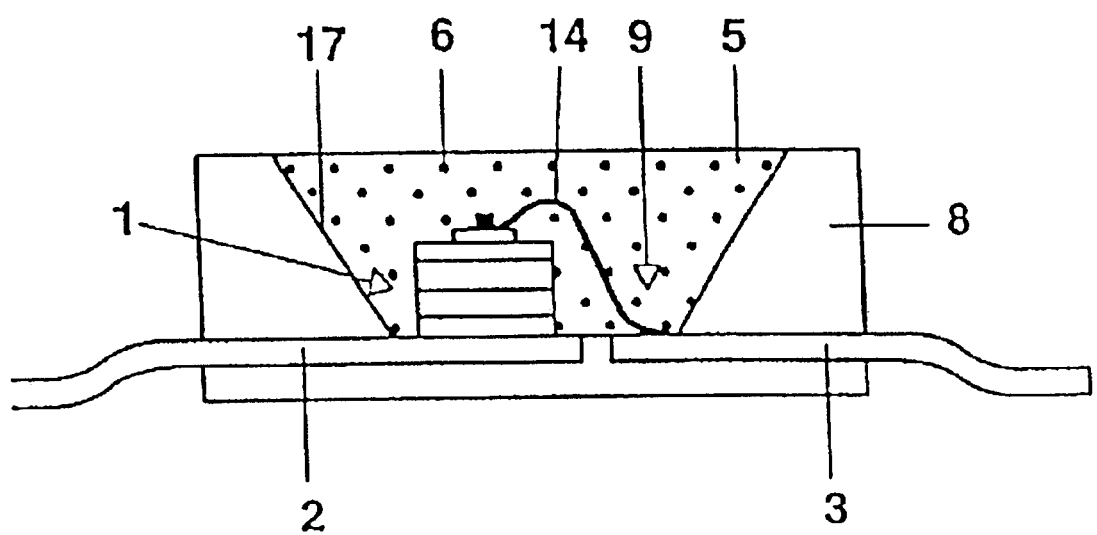
FIG. 1 shows a semiconductor component, which is used as a light source for white light.

The structure of a light source for white light is explicitly shown in FIG. 1. The light source is a semiconductor component with a chip 1 of the InGaN type having a peak emission wavelength of, for example, 460 nm, which is embedded in the vicinity of a recess 9 of an optically opaque base package 8. The chip 1 is connected to a first terminal 3 via a bonding wire 14, and it is directly connected to a second electrical terminal 2. The recess 9 is filled with a potting compound 5, which contains an epoxy casting resin (about 70 to 80% by weight) and phosphor pigments 6 (about 10% by weight) as its main constituents.

Examples of the basic composition of the casting resin and of the converter phosphor, for example YAG:Ce, are given inter alia in U.S. Pat. No. 6,066,861. A converter phosphor, however, is not a necessary constituent. An example of a casting resin without a converter phosphor is given in WO 01/10926.

In the exemplary embodiment, for example, 5% of $CeAlO_3$ is added as a photoprotective agent to the LED conversion phosphor YAG:Ce, generically representing all the LED conversion phosphors. The cerium aluminate in this case has a d50 value of 4.5 μm. As particle sizes for the inorganic photoprotective pigments, d50 values <5.0 μm and d100 values <10.0 μm are preferred, because possible sedimentation problems in the resin master batch and in the A:B potting compounds are thereby minimized. The small particle diameters and the consequently larger active surface area can furthermore increase the effectiveness of the additives in the resin matrix. Before being processed in the plastic, the corresponding pigment or pigment combinations need to be dried, alone or together with the phosphor, for at least 12 h at temperatures >200° C.

Preferred ratios of LED phosphors, such as YAG:Ce, to inorganic photoprotective agents are from 4:1 to 10:1, and the relative proportion should in particular be:

| | |
|---|---|
| LED converter phosphor: | 80% by weight to 96% |
| Inorganic photoprotective agent (e.g. CeAlO$_3$): | 3 to 20% by weight. |

CeAlO3 will be referred to generically in respect of the present stabilization concept, because the product is commercially available inexpensively and ideally has the desired optical filter properties with absorption of UV radiation between 360 nm and 400 nm, while nevertheless exhibiting good optical transmissions at wavelengths >400 nm. A specific exemplary embodiment (type 1 stabilized phosphor) is:

| | |
|---|---|
| YAG: Ce phosphor: | 95% by weight |
| CeA103: | 5% by weight |

Corresponding converter resins, in particular for light-conversion elements in LEDs, advantageously have the following composition:

| | |
|---|---|
| Epoxy casting resin: | $\geq$ 60% by weight |
| LED phosphor | 0 to 40% by weight |
| inorganic photoprotective agent: | 1 to 10% by weight |
| Alcohol: | 0 to 10% by weight, especially $\geq$ 0.1% |
| Pigment surface modifier: | 0 to 3% by weight, especially $\geq$ 0.1% |
| Deaerator: | 0 to 2% by weight, especially $\geq$ 0.1% |
| Release agent: | 0 to 2% by weight, especially $\geq$ 0.1% |
| Adhesion promoter: | 0 to 2% by weight, especially $\geq$ 0.1% |
| Rheological additive: | 0 to 2% by weight, especially $\geq$ 0.1% |
| Thixotropic agent: | 0 to 10% by weight, especially $\geq$ 0.1% |
| Mineral diffusor: | 0 to 10% by weight, especially $\geq$ 0.1% |
| Master batch optical brightener: | 0 to 1% by weight, especially $\geq$ 0.1%. |

The converter resins are used for the LED color locus matching directly or blended with the clear resins mentioned below for the component potting.

With a conversion phosphor containing a photoprotective agent, the following exemplary embodiment was produced for a conversion resin:

| | |
|---|---|
| Bisphenol-A-diglycidyl ether epoxy resin | $\leq$ 80%, esp. 50 to 75% |
| Epoxy resin of the epoxy novolac type | $\leq$ 20%, esp. 5 to 18% |
| Epoxy resin as a reactive diluent | $\leq$ 10%, esp. 3 to 9% |
| Deaerator (BYK A 506, silicone type) | $\leq$ 1%, esp. 0.1 to 0.8% |
| Release agent (DF48, silicone type) | $\leq$ 1%, esp. 0.1 to 0.8% |
| Adhesion promoter (epoxy funct. alkoxysilane, esp. A187) | $\leq$ 1%, esp. 0.1 to 0.8% |
| Brightener (blue organic dye in epoxy) | $\leq$ 1%, esp. 0.1 to 0.8% |
| Pigment surface modifier (diethylene monomethyl ether): | $\leq$ 1%, esp. 0.1 to 0.8% |
| Thixotropic agent (fumed silica, Aerosil 200) | $\leq$ 3% (0.2 to 2.5%) |
| L175 fine phosphor (YAG: Ce, Osram) | $\leq$ 15%, (3 to 12%) |
| UV stabilizer (CeA103) | $\leq$ 5%, esp. 0.2 to 1.5% |

An exemplary embodiment of an epoxy clear resin without a phosphor with an inorganic photoprotective agent is:

| | |
|---|---|
| Epoxy resins and epoxy resin combinations (based on glycidyl ether and glycidyl ester) | 70 to 90% by weight |
| Alcohols: | $\leq$ 10% by weight, esp. 2 to 9%; |
| Radical traps (HALS, sterically hindered amines) | $\leq$ 5% by weight, (0.1–4%); |
| Oxidation stabilizers (sterically hindered phenols, tert.-butanol, P-organic compounds, thioethers, etc.) | $\leq$ 5% by weight, (0.1–4%); |
| Organic light absorbers: (derivatives of: benzophenone, benzotriazole, triazine) | $\leq$ 1% by weight (0.1%) |
| Adhesion promoter (A187): | $\leq$ 5% by weight, (0.1–4%); |
| Rheological additive: | $\leq$ 2% by weight, (0.1–1.5%); |
| Deaerator: | $\leq$ 2% by weight, (0.1–1.5%); |
| Release agent: | $\leq$ 2% by weight, (0.1–1.5%); |
| Thixotropic agent | $\leq$ 10% by weight, (1–5%); |
| Diffusor: | $\leq$ 30% by weight, (4–20%); |
| Inorganic photoprotective agent (e.g. CeA103): | $\leq$ 10% by weight, (1–6%). |

The epoxy clear resins, the epoxy converter resins and combinations thereof are converted with formulated anhydride curer components from opto-electronics, advantageously based on hexahydrophthalic anhydride and methylhexahydrophthalic anhydride or mixtures of the two, acidic ester modifiers, P-organic antioxidants and Zn octoate as an accelerator by application of heat into a solid molding substance with a glass transition temperature >80° C., advantageously >125° C.

Exemplary embodiments of the transparent epoxy molding compositions produced therewith are blends of the transparent molding compositions from Dexter Hysol, Nitto and Sumitomo with

| a) Inorganic photoprotective agent (e.g. CeAlO₃): | ≦ 20% by weight, (1–6%) |
|---|---|
| b) LED converter phosphor: | ≧ 80% by weight, (82–98%) |

Examples of blends of plastics such as silicones, acrylates and thermosets, e.g. LED packages made of Amodel (terephthalamide), are:

| a) Inorganic photoprotective agent (e.g. CeAlO₃) | ≦ 20 % by weight, (0.5–7%) |
|---|---|
| b) LED converter phosphor: | ≧ 80% by weight, (85–99%) |

Examples of the individual resin constituents are explained in more detail below:

a) Epoxy resin, advantageously epoxy casting resin:

Mono-, di- and polyfunctional aliphatic and aromatic resins with ethylene oxide functions, e.g. of the diglycidyl ether and diglycidyl ester type, as well as blends thereof, cycloaliphatic resins with ethylene oxide functions and ring-epoxidized compounds.

b) LED phosphor:

All phosphors of the rare earth garnet type (Gd, Tb, La, Lu, Y)(Al, Ga)$_5$O$_{12}$:(Ce, Eu, Nd, Er, Cr, Mn), especially (Tb)Al$_5$O$_{12}$:Ce, rare earth-doped gallates, thiogallates, silicates, as well as organic phosphors (see, for example, DE-A 38 04 293).

c) Alcohol:

Mono-, di- and polyfunctional aliphatic and cycloaliphatic alcohols, as well as polyether and polyester alcohols.

d) Pigment surface modifier:

Glycol ether derivatives with and without α, ω-OH functions.

e) Deaerator:

e.g. BYK A506 (BYK chemie), silicones, F-organic compounds.

f) Release agent:

Silicones, F-organic compound, salts of long-chained (>C16) carboxylic acids, waxes.

g) Adhesion promoter:

C-functional alkoxysilanes and silanols.

h) Thixotropic agent:

e.g. Aerosil 200 (Degussa), finely disperse silica, finely disperse Al$_2$O$_3$, TiO$_2$ etc. with and without surface treatment.

i) Diffusor:

CaF$_2$, BaSO$_4$, SiO$_2$, TiO$_2$, Al$_2$O$_3$ etc.

j) Optical brightener:

Organic blue dyes (e.g. based on anthraquinone) and inorganic pigments with a corresponding particle size.

k) Dyes:

for transparently colored plastics, e.g. azo and anthraquinone dyes.

Figure 2A:
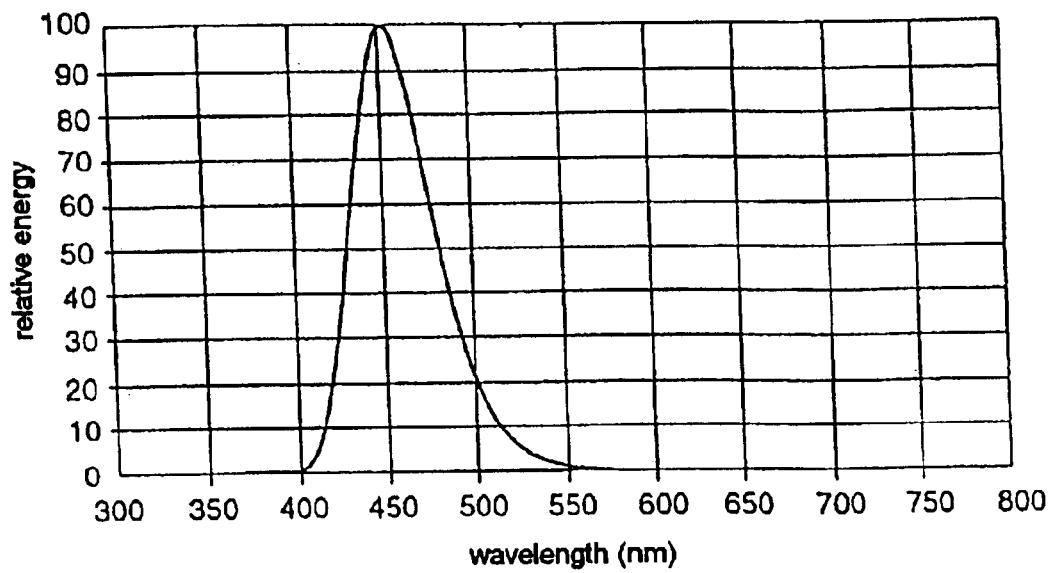
FIG. 2 shows the emission and absorption spectra of a stabilizer.
Figure 2B:
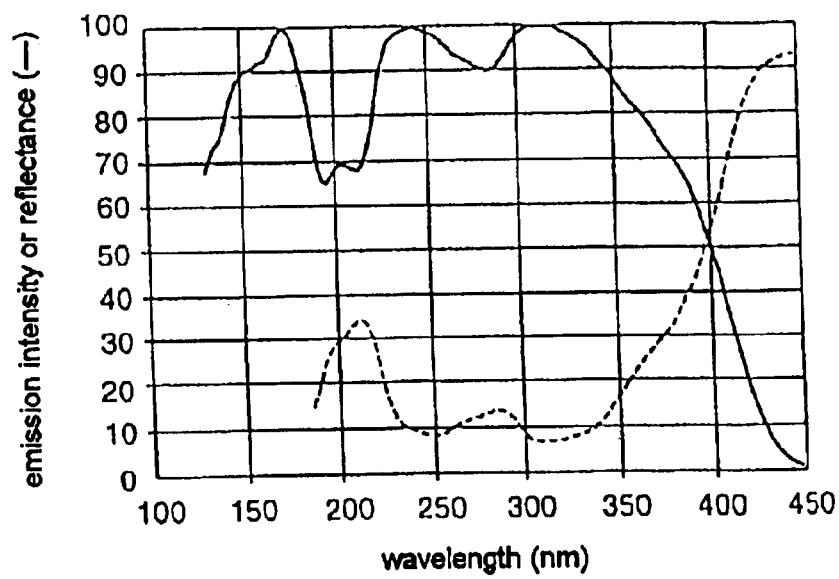

As a further stabilization concept for plastics and the applications described above, inorganic phosphors are claimed which exhibit strong optical absorptions in the UV range up to a maximum of 400 nm, especially from 360 to 390 nm, and which emit the absorbed radiation energy at longer wavelengths, for example Europium-doped (Ba, Mg) aluminate (optionally with a small Mg excess) with the composition BaMgAl$_{10}$O$_{17}$:Eu$^{2+}$, whose emission and absorption are shown in FIG. 2 (Eu proportion in relation to the cation from 5 to 35%); in particular, the BAM may additionally be doped with Mn. By virtue of these phosphors, in a small amount (especially with moderate dosing up to 30%) the color coordinates in LEDs are shifted slightly and further optical absorption-emission effects are generated in the phosphors.

What is claimed is:

1. An opto-electronic semiconductor component with a semiconductor body that emits electromagnetic radiation of a wavelength range with an intensity maximum at a wavelength ≧420 nm, the semiconductor body being embedded in a potting resin which comprises a UV-stable polymer based on a transparent reactive resin matrix and a UV light stabilizer, wherein the UV light stabilizer is an inorganic material which absorbs radiation well at least in the range of from 360 to 400 nm and as far as possible only deactivates non-radiatively, the stabilizer absorbing the UV component ≦400 nm of the emission by the semiconductor body; and the proportion of the stabilizer in relation to the potting resin is from 1 to 20% by weight and wherein the UV-stable polymer is transparent and is selected from the group of materials PMMA, polycarbonate, optical nylon, olefin copolymer, silicone material and epoxy-containing plastic.

2. The opto-electronic semiconductor as claimed in claim 1, wherein the stabilizer is a pigment of the aluminate type with a perovskite structure without luminescent doping.

3. The opto-electronic semiconductor as claimed in claim 1, wherein the potting resin has a converter phosphor as a further constituent.

4. The opto-electronic semiconductor as claimed in claim 3, wherein the stabilizer:converter phosphor ratio is from 1:4 to 1:30.

5. The opto-electronic semiconductor as claimed in claim 1, wherein a doped stabilizer, which absorbs radiation in the range of from 360 to 400 nm and re-emits at long wavelengths in the range of from 420 to 800 nm, is added as the single constituent or as a further constituent.

6. The opto-electronic semiconductor as claimed in claim 5, wherein the doped stabilizer is a further constituent and the ratio between the undoped stabilizer and the doped stabilizer is at least 3:1.

7. The opto-electronic semiconductor as claimed in claim 5, wherein a pigment of the BAN (Ba—Mg aluminate) type is used as the doped stabilizer.

8. The opto-electronic semiconductor as claimed in claim 1, wherein the epoxy-containing plastic is an epoxy resin of the bisphenol or novolac type.

9. The opto-electronic semiconductor as claimed in claim 2, wherein the pigment is cerium aluminate.

* * * * *